(12) United States Patent
Kim et al.

(10) Patent No.: US 8,283,666 B2
(45) Date of Patent: Oct. 9, 2012

(54) THIN FILM TRANSISTOR ARRAY SUBSTRATE AND METHOD OF FABRICATING THE SAME

(75) Inventors: Do-Hyun Kim, Seoul (KR); Je-Hun Lee, Seoul (KR); Pil-Sang Yun, Seoul (KR); Dong-Hoon Lee, Seoul (KR); Bong-Kyun Kim, Incheon (KR)

(73) Assignee: Samsung Electronics Co., Ltd. (KR)

( * ) Notice: Subject to any disclaimer, the term of this patent is extended or adjusted under 35 U.S.C. 154(b) by 552 days.

(21) Appl. No.: 12/500,506

(22) Filed: Jul. 9, 2009

(65) Prior Publication Data
US 2010/0051933 A1    Mar. 4, 2010

(30) Foreign Application Priority Data
Sep. 2, 2008   (KR) .................. 10-2008-0086277

(51) Int. Cl.
*H01L 29/04* (2006.01)

(52) U.S. Cl. .................. 257/57; 257/291; 257/E23.016
(58) Field of Classification Search .................. 257/57, 257/59, 66, 291, E23.016, E27.1, E29.117
See application file for complete search history.

(56) References Cited

U.S. PATENT DOCUMENTS
7,884,360 B2 * 2/2011 Takechi et al. .................. 257/57
* cited by examiner

*Primary Examiner* — Quoc Hoang
(74) *Attorney, Agent, or Firm* — Innovation Counsel LLP

(57) ABSTRACT

A thin film transistor array substrate having a high charge mobility and that can raise a threshold voltage, and a method of fabricating the thin film transistor array substrate are provided. The thin film transistor array substrate includes: an insulating substrate; a gate electrode formed on the insulating substrate; an oxide semiconductor layer comprising a lower oxide layer formed on the gate electrode and an upper oxide layer formed on the lower oxide layer, such that the oxygen concentration of the upper oxide layer is higher than the oxygen concentration of the lower oxide layer; and a source electrode and a drain electrode formed on the oxide semiconductor layer and separated from each other.

9 Claims, 7 Drawing Sheets

THIN FILM TRANSISTOR ARRAY SUBSTRATE AND METHOD OF FABRICATING THE SAME

CROSS-REFERENCE TO RELATED APPLICATION

This application claims priority from Korean Patent Application No. 10-2008-0086277 filed on Sep. 2, 2008 in the Korean Intellectual Property Office, the disclosure of which is incorporated herein by reference in its entirety.

BACKGROUND OF THE INVENTION

1. Field of the Invention

The present invention relates to a thin film transistor array substrate and a method of fabricating the same, and more particularly, to a thin film transistor array substrate and a method of fabricating the same, in which electrical characteristics of an oxide semiconductor layer are improved.

2. Description of the Related Art

A liquid crystal display (LCD) is one of most widely used flat panel display configurations. The LCD includes two substrates on which electrodes are formed, and a liquid crystal layer interposed between the two substrates. Voltages are applied to the electrodes to realign the liquid crystal molecules of the liquid crystal layer and control the amount of light that is transmitted through the liquid crystal layer.

Among the different types of LCDs, the most common structure involves positioning electric field-generating electrodes on each of first and second substrates. A plurality of pixel electrodes are arranged in a matrix configuration on the first substrate (i.e., thin film transistor array substrate), and a single common electrode is positioned covering the entire surface of the second substrate.

The display of images is achieved by applying a separate voltage to each of the pixel electrodes. To realize such operation, a three-terminal thin film transistor is connected to each pixel electrode in order to perform switching of the voltage applied thereto, and a plurality of wiring structures, which include gate lines for transmitting signals for controlling the thin film transistors and data lines for transmitting the voltages applied to the pixel electrodes, are formed on the substrates.

In the conventional LCD, amorphous silicon thin film transistors or polycrystalline silicon thin film transistors are used, depending on the material forming the channel regions of the switching elements. Amorphous silicon thin film transistors have a low charge mobility at approximately 0.5 $cm^2/Vs$, but allow uniform electrical characteristics to be achieved in large display devices. Polycrystalline silicon thin film transistors, on the other hand, have a high charge mobility of approximately several hundred $cm^2/Vs$, but make it difficult to achieve uniform electrical characteristics in a large display device.

SUMMARY OF THE INVENTION

Aspects of the present invention include a thin film transistor array substrate which has a high charge mobility and allows uniform electrical characteristics to be achieved when applied to a large display device.

Aspects of the present invention also include a method of fabricating the thin film transistor array substrate.

However, the aspects of the present invention are not restricted to those set forth herein. The above and other aspects of the present invention will become more apparent to one of ordinary skill in the art to which the present invention pertains by referencing a detailed description of the present invention given below.

According to one aspect of the present disclosure of invention, there is provided a thin film transistor array substrate including: an insulating substrate; a gate electrode formed on the insulating substrate; an oxide semiconductor layer (a.k.a. 'semiconductive oxide') comprising a lower oxide layer formed on the gate electrode, and an upper oxide layer formed on the lower oxide layer such that an oxygen concentration of the upper oxide layer is higher than an oxygen concentration of the lower oxide layer; and a source electrode and a drain electrode formed on the oxide semiconductor layer and separated from each other.

Another aspect of the present invention is a method of fabricating a thin film transistor array substrate including: forming a gate electrode on an insulating substrate; forming a lower oxide layer on the gate electrode; forming an upper oxide layer on the lower oxide layer, an oxygen concentration of the upper oxide layer being higher than an oxygen concentration of the lower oxide layer; patterning the lower oxide layer and the upper oxide layer to form an oxide semiconductor layer comprising the lower oxide layer and the upper oxide layer; and forming a source electrode and a drain electrode on the oxide semiconductor layer, the source electrode and the drain electrode separated from each other.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EXEMPLARY EMBODIMENTS

The invention will now be described more fully hereinafter with reference to the accompanying drawings, in which exemplary embodiments of the present invention are illustrated. The invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers denote like elements throughout the specification. As used herein the term "and/or" includes any and all combinations of one or more of the associated listed items.

Furthermore, relative terms such as "below," "beneath," or "lower," "above," and "upper" may be used herein to describe one element's relationship to another element as illustrated in the accompanying drawings. However, it will be understood that relative terms are intended to encompass different orientations of the invention in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath," when used to describe a particular element's spatial relationship to another element, can encompass orientations of that element both above and below another element, depending on the orientation of the device.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. Thus, the regions illustrated in the figures are schematic in nature and their shapes are not intended to illustrate the actual shape of a region of a device and are not intended to limit the scope of the invention, unless expressly so defined herein.

Figure 1:
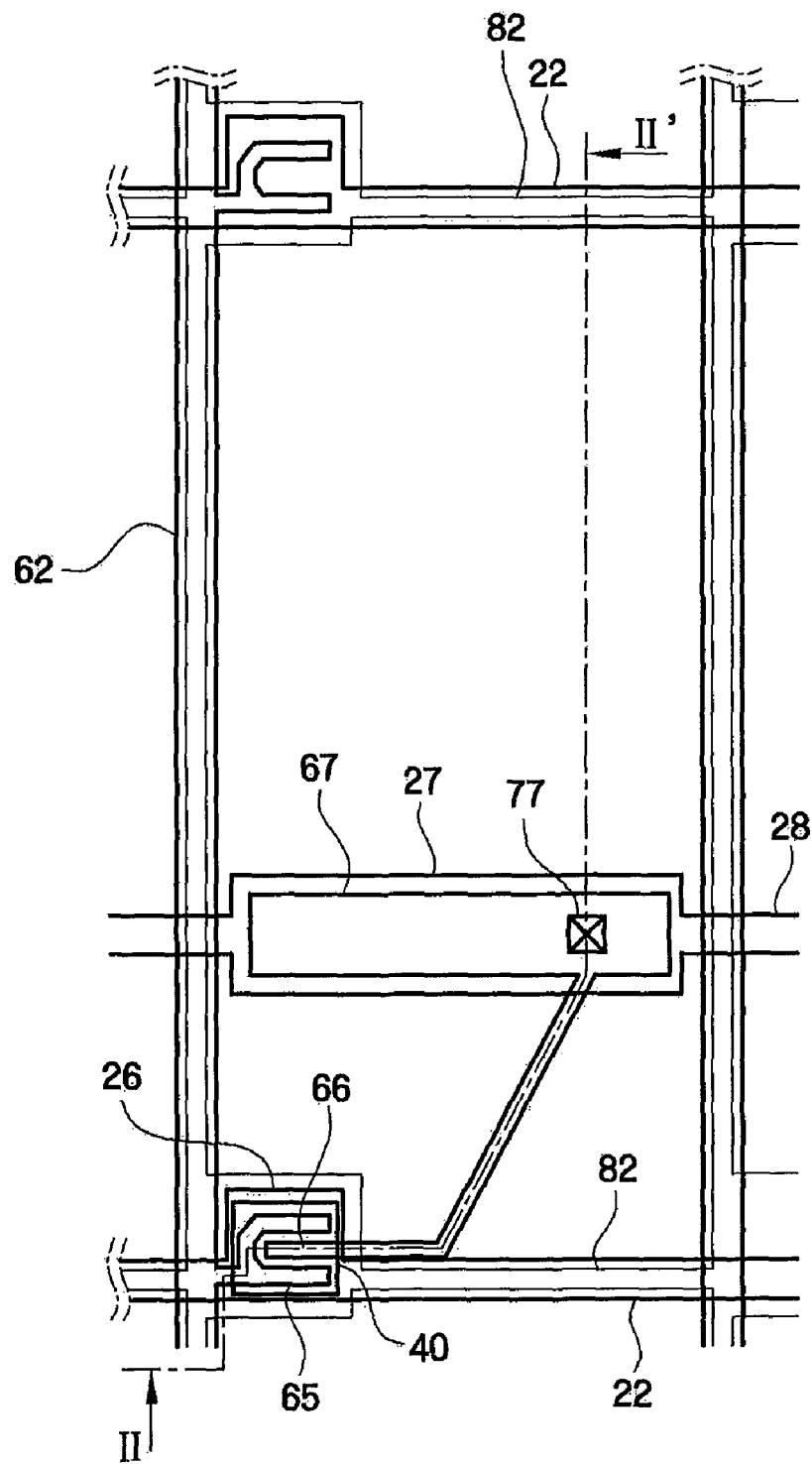
FIG. 1 is a schematic view of a thin film transistor array substrate according to an embodiment of the present invention.
Figure 2:
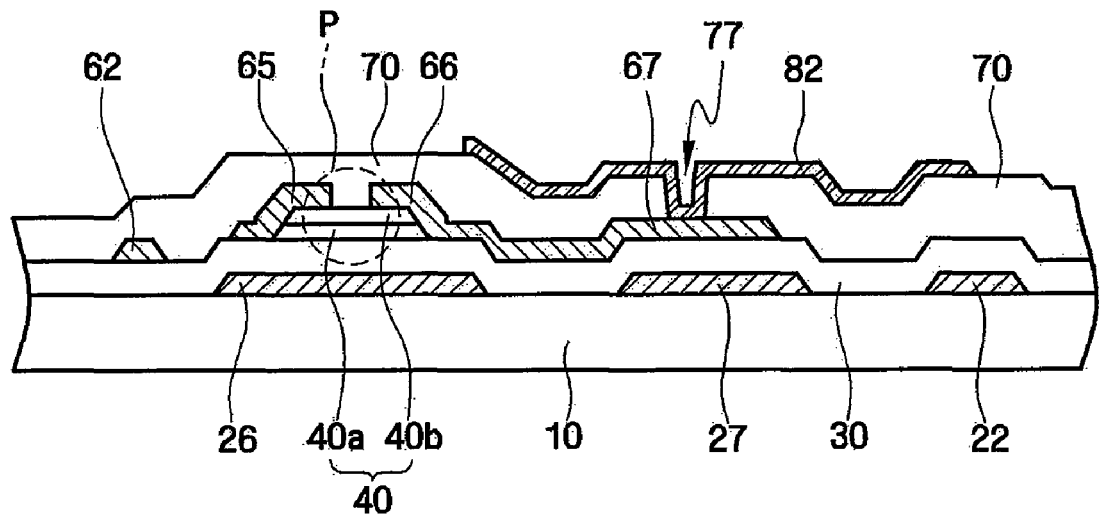
FIG. 2 is a sectional view taken along line II-II' of FIG. 1.

A thin film transistor array substrate according to an embodiment of the present invention will hereinafter be described in detail with reference to FIGS. 1 and 2. FIG. 1 is a schematic view of a thin film transistor array substrate according to an embodiment of the present invention. FIG. 2 is a sectional view taken along line II-II' of FIG. 1.

Referring to FIGS. 1 and 2, gate wiring 22, 26 which transmits gate signals is formed on an insulating substrate 10. The gate wiring 22, 26 includes gate lines 22 which extend horizontally, and thin film transistor gate electrodes 26 which are connected to the gate lines 22 and formed as protrusions.

In addition, storage wiring 27, 28 which transmits storage voltages is formed on the insulating substrate 10. The storage wiring 27, 28 includes storage lines 28 which intersect pixel regions and are substantially parallel to the gate lines 22, and storage electrodes 27 which are connected to and have a width greater than the storage lines 28. The storage electrodes 27 overlap drain electrode expansion sections 67 which are connected to pixel electrodes 82 (to be described below) to thereby form storage capacitors which enhance the charge conservation capability of pixels. The shape and arrangement of the storage electrodes 27 and the storage lines 28 may be changed in a variety of ways, and when storage capacitances created by the overlapping of the pixel electrodes 82 and the gate lines 22 are sufficient, it is unnecessary to form the storage electrodes 27 and the storage lines 28.

The gate wiring 22, 26 and the storage wiring 27, 28 may be made formed from, for example, an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chrome (Cr), titanium (Ti), or tantalum (Ta). Furthermore, the gate wiring 22, 26 and the storage wiring 27, 28 may have a multilayer structure including two conductive layers (not shown) having different physical characteristics. One of the conductive layers may be made of a metal having a low resistivity, such as an aluminum-based metal, a silver-based metal, or a copper based metal, such that signal delay or voltage reduction of the gate wiring 22, 26 and the storage wiring 27, 28 may be reduced. In contrast, the other conductive layer may be made of another material, and in particular, a material that has good contact characteristics with zinc oxide (ZnO), indium tin oxide (ITO), or indium zinc oxide (IZO) (such as, for example, a molybdenum-based metal, chrome, titanium, or tantalum). Examples of good combinations include a chrome lower layer and an aluminum upper layer, or an aluminum lower layer and a molybdenum upper layer. However, the present invention is not limited in this regard, and the gate wiring 22, 26 and the storage wiring 27, 28 may be made of various other types of metals and conductive materials.

A gate insulating layer 30 made of silicon oxide (SiOx) or silicon nitride (SiNx) is formed on the insulating substrate 10 and the gate wiring 22, 26.

An oxide semiconductor layer 40 comprising a lower oxide layer 40a and an upper oxide layer 40b is formed on the gate insulating layer 30. Each of the lower oxide layer 40a and the upper oxide layer 40b may include an oxide of a material selected from Zn, In, Ga, Sn, Hf, and combinations thereof. For example, a mixed oxide, such as ZnO, InZnO, InGaO, InSnO, ZnSnO, GaSnO, GaZnO, GaZnSnO, or GaInZnO, may be used for each of the lower oxide layer 40a and the upper oxide layer 40b. Substantially the same oxide or different oxides may be used for the lower oxide layer 40a and the upper oxide layer 40b. The oxide semiconductor layer 40 configured in this way has a charge effective mobility that is 2 to 100 times greater than that of hydrogenated amorphous silicon, and has an on/off current ratio of $10^5$ to $10^8$ which gives it excellent semiconductor characteristics. Furthermore, since the band gap of the oxide semiconductor layer 40 is between 3.0 and 3.5 eV, leakage photoelectric current with respect to visible light is not generated. Accordingly, instantaneous afterimage of oxide thin film transistors may be prevented, making it unnecessary to form a light blocking layer under the oxide thin film transistors, and thus increasing the aperture ratio of the LCD. In order to enhance the electrical characteristics of an oxide semiconductor, a Group 3, Group 4, Group 5, or transition element from the periodic table may be supplementarily included. Furthermore, since the materials forming the oxide semiconductor layer 40 have good ohmic contact characteristics with respect to data wiring 62, 65, 66, 67 (to be described below), it is unnecessary to form an additional ohmic contact layer, thereby allowing for a reduction in manufacturing time. Additionally, although the majority of the oxide semiconductor layer 40 is an amorphous state, the oxide semiconductor layer 40 has a high charge effective mobility, and existing manufacturing processes for amorphous silicon may be used without any change, such that application to large display devices is possible.

For a semiconductor layer including thin film transistors, mobility and threshold voltage are important physical properties. The higher the mobility, the greater the reduction in signal processing time. Therefore, a semiconductor layer with a high mobility is desirable for use in a large display device. With respect to threshold voltage, if this parameter is too low, then the thin film transistors are continuously in a turn on state with respect to the typical gate on voltage; hence, it is necessary to prevent an excessive drop in the threshold voltage.

Where the oxygen concentration in an oxide semiconductor is low, mobility is increased but threshold voltage is reduced. On the other hand, if the oxygen concentration in an oxide semiconductor is high, mobility is reduced but threshold voltage is increased. For example, where plasma containing oxygen gas is used to form an oxide semiconductor on a substrate, if the concentration of oxygen gas is low, the concentration of oxygen in the oxide semiconductor layer formed on the substrate is also low. An oxide semiconductor with a low oxygen concentration has a greater number of oxygen vacancies than an oxide semiconductor with a high oxygen concentration. A large number of oxygen vacancies means that there are a large number of carriers for transferring charge in the oxide semiconductor. Accordingly, in an oxide semiconductor with a low oxygen concentration, charge mobility is increased and the thin film transistors may be easily turned on in response to a low gate on voltage, which in turn decreases the threshold voltage. In contrast, an oxide semiconductor with a high oxygen concentration has a lower number of oxygen vacancies, i.e., charge carriers, than an oxide semiconductor with a low oxygen concentration. Accordingly, in an oxide semiconductor with a high oxygen concentration, charge mobility is decreased and the thin film transistors may be turned on in response to a high gate on voltage, which in turn increases the threshold voltage.

In this embodiment, in order to prevent excessive reduction of the threshold voltage while maintaining a high mobility of the oxide semiconductor layer 40, the lower oxide layer 40a of oxide semiconductor layer 40 has a relatively low oxygen concentration and the upper oxide layer 40b of oxide semiconductor layer 40 has a relatively high oxygen concentration. In other words, in this embodiment, the oxygen concentration of the lower oxide layer 40a is lower than the oxygen concentration of the upper oxide layer 40b. In the oxide semiconductor layer 40, the lower oxide layer 40a functions to increase mobility, while the upper oxide layer 40b functions to prevent excessive decrease in the threshold voltage. In particular, turn on/turn off of the thin film transistors is determined by the interface between the oxide semiconductor layer 40 and the source electrode 65, and between the oxide semiconductor layer 40 and the drain electrode 66. Hence, the upper portion of the oxide semiconductor layer 40, i.e., the upper oxide layer 40b that contacts the source and drain electrodes 65, 66, is made of an oxide semiconductor with a relatively high oxygen concentration in this embodiment. Furthermore, a channel portion in the oxide semiconductor layer 40 is formed in the lower portion of the oxide semiconductor layer 40 adjacent to the gate electrode 26. Hence, the lower oxide layer 40a that contacts the channel portion is formed of an oxide semiconductor with a relatively low oxygen concentration in this embodiment.

The oxide semiconductor layer 40 is formed to a thickness of approximately 50 to 200 nm. The upper oxide layer 40b is formed to a thickness that is approximately 60 to 80% of the total thickness of the oxide semiconductor layer 40.

In the case of the oxide thin film transistors of this embodiment, the patterning of the oxide semiconductor layer 40 and of the data wiring 62, 65, 66, 67 are different. However, when a 4-sheet mask process is used, the oxide semiconductor layer 40 may be patterned substantially the same as the data wiring 62, 65, 66, 67 which provides a channel function. This is due to the fact that a single etching mask is used to pattern the oxide semiconductor layer 40 and the data wiring 62, 65, 66, 67. In this embodiment, while a structure manufactured by a 5-sheet mask process is provided as an example, the present invention is not limited in this regard, and processes different from the 5-sheet mask process (such as, for example, a 3-sheet or a 4-sheet mask process) still fall within the scope of the present invention, as would be evident to those skilled in the art.

The data wiring 62, 65, 66, 67 is formed on the oxide semiconductor layer 40 and the gate insulating layer 30. The data wiring 62, 65, 66, 67 includes data lines 62 which extend approximately perpendicularly to gate lines 22 to define a pixel (as shown in FIG. 1), a source electrode 65 which is branched from the data line 62 and extends onto the oxide semiconductor layer 40, a drain electrode 66 which is separated from the source electrode 65 and is formed on the oxide semiconductor layer 40 opposing the source electrode 65 above the gate electrode 26 or the channel portion of the oxide thin film transistor, and a drain electrode expansion section 67 having a large area and extending from the drain electrode 66 and overlapping the storage electrode 27.

The data wiring 62, 65, 66, 67 may be formed of a material that directly contacts the oxide semiconductor layer 40 to form an ohmic contact therewith. If the data wiring 62, 65, 66, 67 is made of a material with a lower work function than the material forming the oxide semiconductor layer 40, an ohmic contact may be formed between the two layers. Accordingly, if the work function of the oxide semiconductor layer 40 is approximately 5 eV or higher, for example, 5.1 to 5.3 eV, the data wiring 62, 65, 66, 67 may be formed of a material with a work function that is less than 5 eV. Furthermore, an increase in the contact resistor characteristics may be realized if the difference in work functions between the data wiring 62, 65, 66, 67 and the oxide semiconductor layer 40 is 1.5 eV or less. Accordingly, in order to achieve an ohmic contact with the oxide semiconductor layer 40, the data wiring 62, 65, 66, 67 may be formed of a single-layer or a multilayer structure of Ni, Co, Ti, Ag, Cu, Mo, Al, Be, Nb, Au, Fe, Se, or Ta, which are listed in Table 1 below. In addition, alloys in which one or more of Ti, Zr, W, Ta, Nb, Pt, Hf, O, and N are combined with the above metals may also be used.

Table 1 lists work functions of metal materials used for the data wiring 62, 65, 66, 67.

TABLE 1

| | Metal | | | | | |
|---|---|---|---|---|---|---|
| | Ni | Co | Ti | Ag | Cu | Mo |
| Work function(eV) | 5.01 | 5.0 | 4.7 | 4.73 | 4.7 | 4.5 |

| | Metal | | | | |
|---|---|---|---|---|---|
| | Al | Be | Nb | Au | Fe | Se |
| Work function(eV) | 4.08 | 5.0 | 4.3 | 5.1 | 4.5 | 5.11 |

Due to the reaction resulting from direct contact between the oxide semiconductor layer 40 and a metal of Al, Cu, Ag, etc., the characteristics of the oxide thin film transistors (which use these metals for the data wiring 62, 65, 66, 67) and/or the ohmic contact characteristics with ITO or IZO (which is generally used for the pixel electrodes 82) may deteriorate. Therefore, a double- or triple-layer structure is used for the data wiring 62, 65, 66, 67.

When Al or an Al alloy including one or more of Nd, Sc, C, Ni, B, Zr, Lu, Cu or Ag is used for the data wiring 62, 65, 66, 67, a multi-layer structure may be used in which an additional layer is stacked above and/or below the Al or Al alloy. For example, a double-layer structure may be used, such as Mo(Mo alloy)/Al(Al alloy), Ti(Ti alloy)/Al(Al alloy), Ta(Ta alloy)/Al(Al alloy), Ni(Ni alloy)/Al(Al alloy), Co(Co alloy)/Al(Al alloy), or a triple-layer structure may be used, such as Ti(Ti alloy)/Al(Al alloy)/Ti(Ti alloy), Ta(Ta alloy)/Al(Al alloy)/Ta(Ta alloy), Ti(Ti alloy)/Al(Al alloy)/TiN, Ta(Ta alloy)/Al(Al alloy)/TaN, Ni(Ni alloy)/Al(Al alloy)/Ni(Ni alloy), Co(Co alloy)/Al(Al alloy)/Co(Co alloy), or Mo(Mo alloy)/Al(Al alloy)/Mo(Mo alloy). For the alloys provided in these examples, Mo, W, Nb, Zr, V, O or N may be included therein.

When Cu or a Cu alloy is used for the data wiring 62, 65, 66, 67, there are no significant problems with the ohmic contact characteristics between the data wiring 62, 65, 66, 67 and the pixel electrode 82. Therefore, when Cu or a Cu alloy is used for the data wiring 62, 65, 66, 67, a double-layer structure may be used in which there is a layer including Mo, Ti, or Ta between the Cu or Cu alloy layer and the oxide semiconductor layer 40. Such a double-layer structure may include Mo(Mo alloy)/Cu, Ti(Ti alloy)/Cu, TiN(TiN alloy)/Cu, Ta(Ta alloy)/Cu, or TiOx/Cu.

The source electrode 65 at least partially overlaps the oxide semiconductor layer 40, and the drain electrode 66 opposes the source electrode 65 about the channel portion of the thin film transistor and at least partially overlaps the oxide semiconductor layer 40.

The drain electrode expansion section 67 is formed overlapping the storage electrode 27, and forms a storage capacitance with the storage electrode 27 with the gate insulating layer 30 interposed therebetween. When the storage electrode 27 is not formed, the drain electrode 67 similarly does not need to be formed.

A protection layer 70 is formed on the data wiring 62, 65, 66, 67 and the oxide semiconductor layer 40 exposed by the data wiring 62, 65, 66, 67. The protection layer 70 may be formed, for example, from an inorganic material such as silicon nitride or silicon dioxide, an organic material having good planarization characteristics and that is photosensitive, or an insulating material having a low permittivity such as a-Si:C:O, a-Si:O:F, etc. formed by Plasma Enhanced Chemical Vapor Deposition (PECVD). The protection layer 70 may also be formed of a double-layer structure including a lower inorganic layer and an upper organic layer.

A contact hole 77, which exposes the drain electrode expansion section 67, is formed in the protection layer 70. The pixel electrode 82 is formed on the protection layer 70 and is electrically connected to the drain electrode 66 via the contact hole 77. The pixel electrode 82 is made of a transparent conductive material such as ITO (Indium Tin Oxide) or IZO (Indium Zinc Oxide), or a reflective conductive material such as aluminum.

The pixel electrode 82, to which a data voltage is applied, forms an electric field with a common electrode of the upper substrate opposing the thin film transistor array substrate to thereby determine the alignment of liquid crystal molecules of the liquid crystal layer between the pixel electrode 82 and the common electrode.

The characteristics of the oxide semiconductor layer 40 of the thin film transistor array substrate according to this embodiment of the present invention will now be described with reference to FIGS. 3 to 8.

Figure 3:
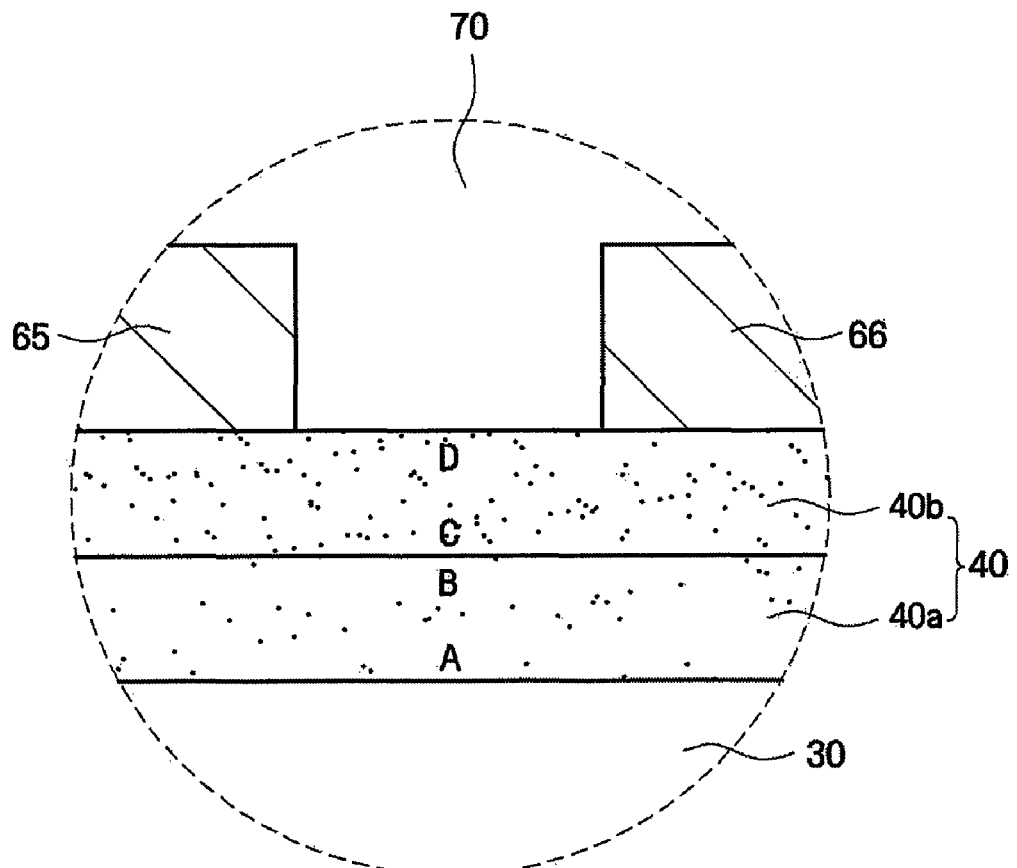
FIG. 3 is an enlarged sectional view of area P of the thin film transistor array substrate of FIG. 2.
Figure 4:
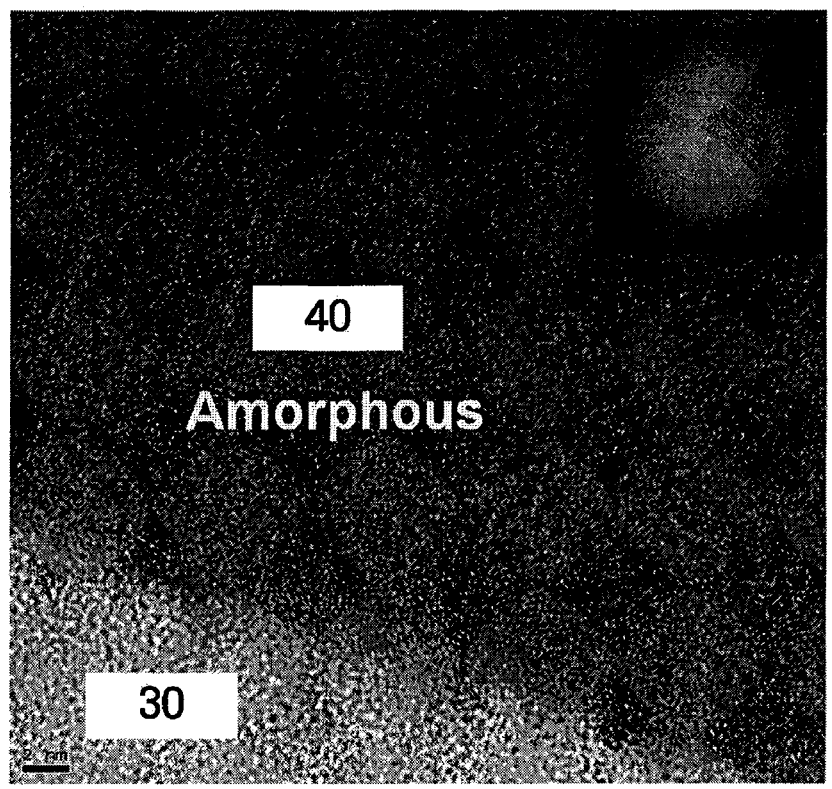
FIG. 4 is a TEM image of region A of an oxide semiconductor layer of FIG. 3.
Figure 5:
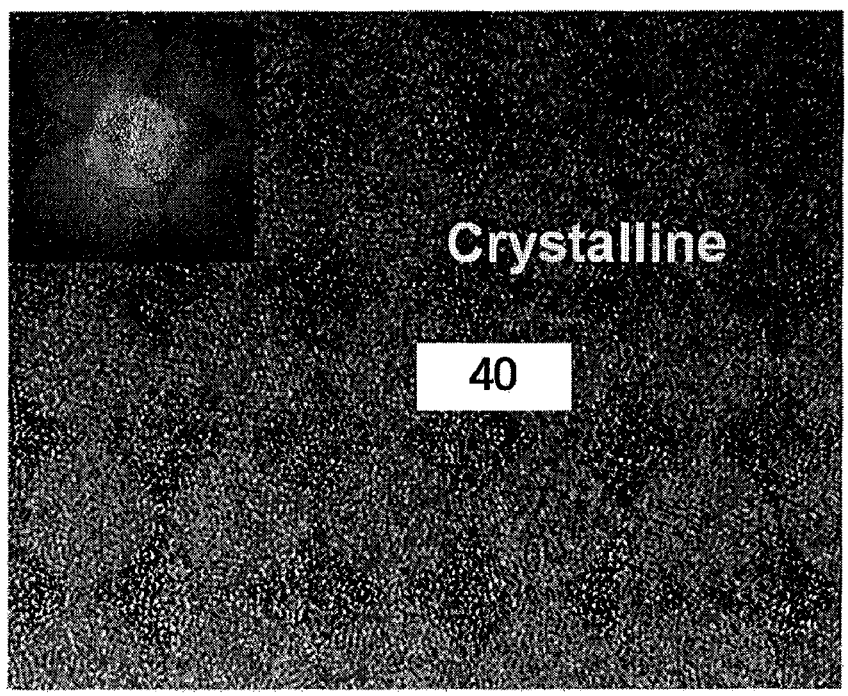
FIG. 5 is a TEM image of region B of the oxide semiconductor layer of FIG. 3.

FIG. 3 is an enlarged sectional view of area P of the thin film transistor array substrate of FIG. 2. FIG. 4 is a TEM (Transmission Electron Microscope) image of region A of the oxide semiconductor layer 40 of FIG. 3. FIG. 5 is a TEM image of region B of the oxide semiconductor layer 40 of FIG. 3. FIGS. 4 and 5 show images obtained with respect to the oxide semiconductor layer 40 formed using InZnO to which Hf has been added.

Referring to FIGS. 3 to 5, region A of the lower oxide layer 40a which is adjacent to the gate insulation layer 30 is in an amorphous state, and region B of the lower oxide layer 40a which is adjacent to the upper oxide layer 40b is in a crystalline state. The upper oxide layer 40b, in a manner substantially identical to the lower oxide layer 40a, also has a lower region C that is an amorphous state and an upper region D that is in a crystalline state. Accordingly, the lower oxide layer 40a and the upper oxide layer 40b may be identified and distinguished by their TEM images.

However, the present invention is not limited in this regard, and the upper oxide layer 40b and the lower oxide layer 40a may both be in an amorphous state. That is, according to the concentration of Hf added to InZnO, the upper oxide layer 40b and the lower oxide layer 40a may both be in an amorphous state. When this is the case, the upper oxide layer 40b and the lower oxide layer 40a may be identified and distinguished by measuring oxygen concentration in a thickness direction of the oxide semiconductor layer 40 using SIMS (Secondary Ion Mass Spectroscopy).

Figure 6:
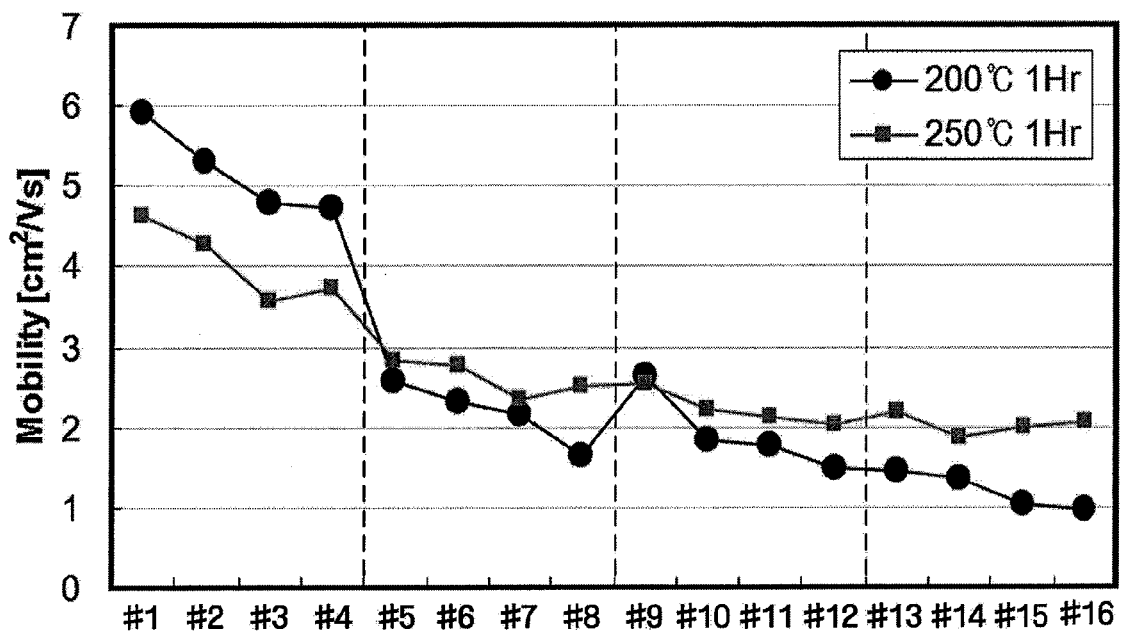
FIG. 6 is a graph of measured mobilities for various oxide semiconductor samples having different partial pressure ratios of argon gas to oxygen gas.
Figure 7:
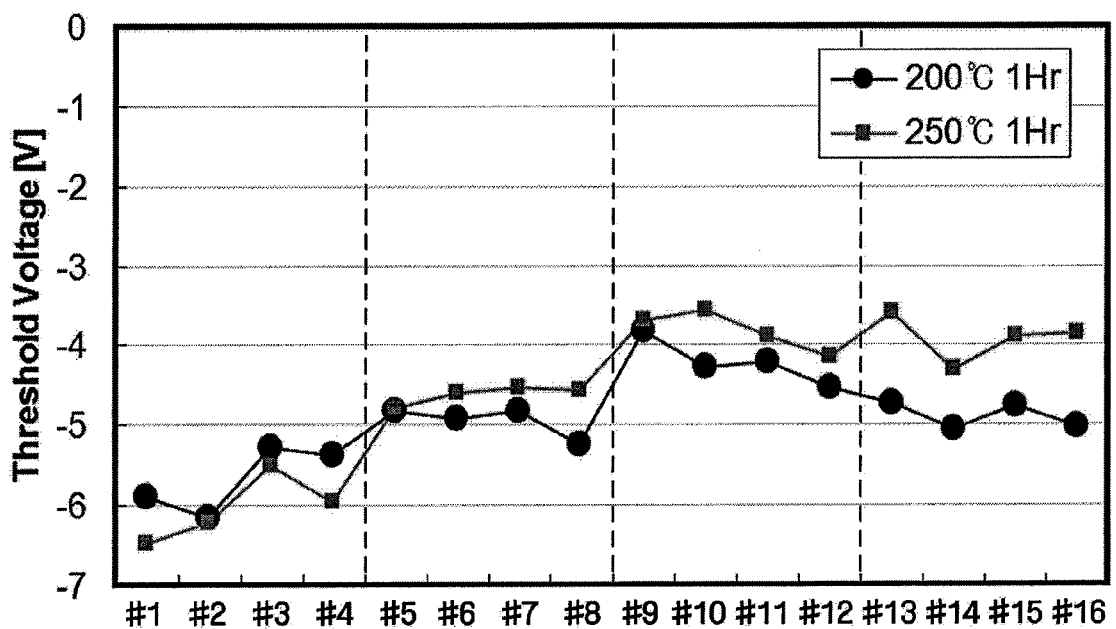
FIG. 7 is a graph of measured threshold voltages for various oxide semiconductor samples having different partial pressure ratios of argon gas to oxygen gas.

FIG. 6 is a graph of measured mobilities for various oxide semiconductor samples having different partial pressure ratios of argon gas to oxygen gas. FIG. 7 is a graph of measured threshold voltages for various oxide semiconductor samples having different partial pressure ratios of argon gas to oxygen gas.

In the experimental examples of FIG. 6 and FIG. 7, oxide semiconductor samples were made from InZnO in which Hf was added and which were produced by reactive sputtering utilizing argon gas and oxygen gas. For the gate insulating layer, a double-layer structure was used in which silicon dioxide was stacked on silicon nitride, and for the protection layer, silicon nitride was used. The experiment was performed by dividing each of the samples into 4 groups according to the partial pressure ratio of argon gas to oxygen gas. Samples #1 through #4 were those in which the ratio of argon gas to oxygen gas ($Ar/O_2$) was 5/1, samples #5 through #8 were those in which the ratio of argon gas to oxygen gas ($Ar/O_2$) was 5/4, samples #9 through #12 were those in which the ratio of argon gas to oxygen gas ($Ar/O_2$) was 5/7, and samples #13 through #16 were those in which the ratio of argon gas to oxygen gas ($Ar/O_2$) was 5/9. Following completion of the thin film transistor array substrate, the mobility and threshold voltage of each sample was then measured according to heat-treating conditions used when performing a heat-treating process (e.g., annealing). The heat-treating conditions included heating for one hour at 200 degrees Celsius, and heating for one hour at 250 degrees Celsius.

With reference to FIG. 6, it is evident that increases in mobility are obtained with higher partial pressure ratios of argon gas to oxygen gas ($Ar/O_2$), i.e., with lower oxygen concentrations in the oxide semiconductor. In order to obtain a relatively high mobility, the partial pressure ratio of argon gas to oxygen gas (Ar/O$_2$) should be 5/1 or greater in this embodiment. Stated differently, when the partial pressure of oxygen gas is 0.2 or less, an oxide semiconductor with a relatively high mobility may be obtained.

With reference to FIG. 7, it is evident that threshold voltage is increased with lower partial pressure ratios of argon gas to oxygen gas (Ar/O$_2$), i.e., with higher oxygen concentrations in the oxide semiconductor. In order to obtain a relatively high threshold voltage, the partial pressure ratio of argon gas to oxygen gas (Ar/O$_2$) should be 5/7 or less in this embodiment. Stated differently, when the partial pressure of oxygen gas is 0.55 or greater, an oxide semiconductor with a relatively high threshold voltage may be obtained.

Referring to FIGS. 2, 6, and 7, since the lower oxide layer 40a functions to increase the overall mobility of the oxide semiconductor layer 40, when forming the lower oxide layer 40a, the partial pressure ratio of argon gas to oxygen gas (Ar/O$_2$) is 5/1 or greater in this embodiment. In other words, the partial pressure of oxygen gas is 0.2 or less in this embodiment.

Further, since the upper oxide layer 40b functions to increase the overall threshold voltage of the oxide semiconductor layer 40, when forming the upper oxide layer 40b, the partial pressure ratio of argon gas to oxygen gas (Ar/O$_2$) is 5/7 or less in this embodiment. In other words, the partial pressure of oxygen gas is 0.55 or greater in this embodiment.

Figure 8:
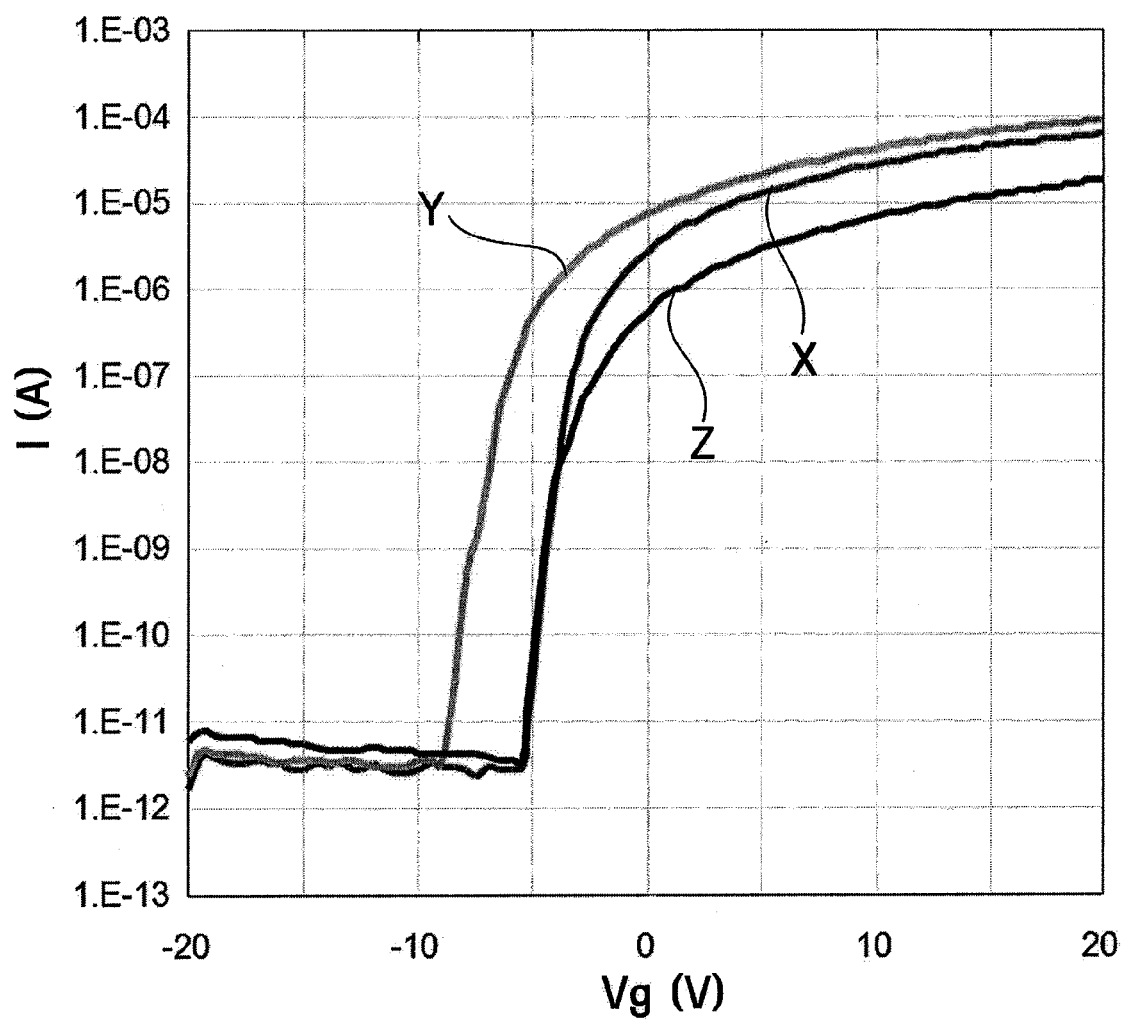
FIG. 8 is a graph of measured current (I) flowing in oxide semiconductor layers according to changes in a gate voltage (Vg)

FIG. 8 is a graph of measured current (I) flowing in oxide semiconductor layers according to changes in a gate voltage (Vg). Sample X is an oxide semiconductor layer having a double-layer structure that is formed of a lower oxide layer with a partial pressure ratio of argon gas to oxygen gas (Ar/O$_2$) of 5/1, and an upper oxide layer with a partial pressure ratio of argon gas to oxygen gas (Ar/O$_2$) of 5/7. Sample Y is an oxide semiconductor layer having a single-layer structure that is formed of an oxide layer with a partial pressure ratio of argon gas to oxygen gas (Ar/O$_2$) of 5/1. Sample Z is an oxide semiconductor layer having a single-layer structure that is formed of an oxide layer with a partial pressure ratio of argon gas to oxygen gas (Ar/O$_2$) of 5/7.

The electrical characteristics of these samples are as shown in Table 2 below. Ion is the current flowing in the oxide semiconductor layer when the thin film transistor is turned on, and Ioff is the current flowing in the oxide semiconductor layer when the thin film transistor is turned off.

TABLE 2

|  | Ion (A) | Ioff (A) | Mobility (Cm$^2$/Vs) | Threshold voltage (V) |
| --- | --- | --- | --- | --- |
| Sample X | 6.28 × 10$^{-5}$ | 1.69 × 10$^{-12}$ | 4.72 | −3.99 |
| Sample Y | 9.14 × 10$^{-5}$ | 2.29 × 10$^{-12}$ | 4.49 | −6.73 |
| Sample Z | 1.81 × 10$^{-5}$ | 3.65 × 10$^{-12}$ | 1.07 | −3.72 |

As shown in FIG. 8 and Table 2, sample X, which is formed of a lower oxide layer with a relatively low oxygen concentration and an upper oxide layer of a relatively high oxygen concentration, has a similar charge mobility as sample Y, which is formed of only an oxide semiconductor layer having a relatively low oxygen concentration, and has a similar threshold voltage as sample Z, which is formed of only an oxide semiconductor layer having a relatively high oxygen concentration. Accordingly, in the present invention, mobility and threshold voltage are simultaneously increased through use of an oxide semiconductor layer having a double-layer structure made up of layers with different oxygen concentrations. In particular, the oxide semiconductor layer of this embodiment has a mobility of approximately 4.5 cm$^2$/Vs or greater, and a threshold voltage of approximately −4V or greater.

A method of fabricating a thin film transistor array substrate according to an embodiment of the present invention will hereinafter be described in detail with reference to FIGS. 9 to 13. FIGS. 9 to 13 illustrate sectional views of a thin film transistor array substrate as the same undergoes sequential steps in a method of fabricating a thin film transistor array substrate according to an embodiment of the present invention.

Figure 9:
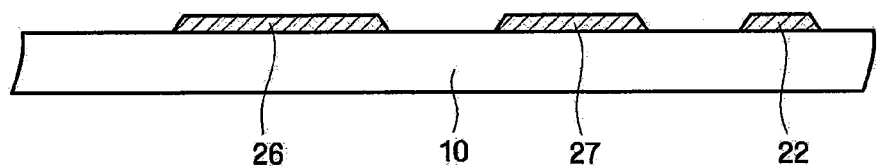
FIGS. 9 to 13 illustrate sectional views of a thin film transistor array substrate as the thin film transistor array substrate undergoes sequential steps in a method of fabricating the same according to an embodiment of the present invention.

With reference to FIGS. 1 and 9, a gate line 22, a gate electrode 26, a storage electrode 27, and a storage line 28 are formed on an insulating substrate 10.

The insulating substrate 10 may be made of glass, such as soda lime glass or silicate glass, or plastic. A sputtering method may be used to form the gate wiring 22, 26. When patterning the gate wiring 22, 26, wet etching or dry etching may be used. Where wet etching is used, an etchant such as phosphoric acid, nitric acid, or acetic acid may be used. Where dry etching is used, a chlorine-based etching gas, e.g., Cl$_2$, BCl$_3$, etc., may be used.

Figure 10:
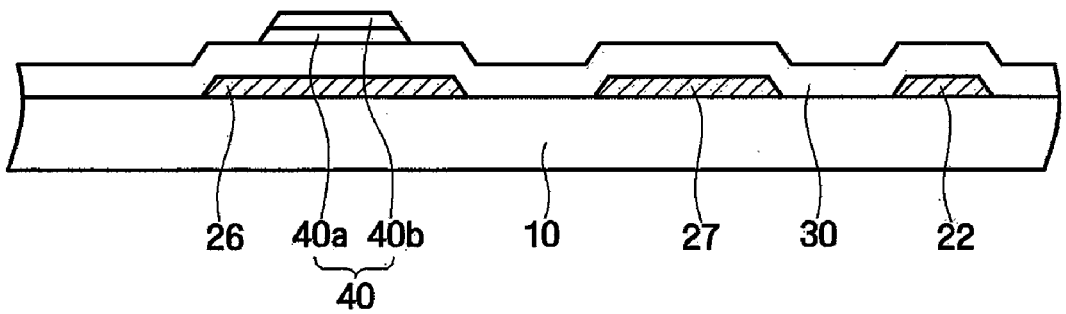

Subsequently, with reference to FIGS. 1 and 10, a gate insulating layer 30 is formed on the insulating layer 10 and the gate wiring 22, 26 by plasma enhanced chemical vapor deposition (PECVD) or reactive sputtering.

Next, an oxide semiconductor layer 40 is formed on the gate insulating layer 30. To describe the formation of the oxide semiconductor layer 40 in greater detail, a lower oxide layer 40a is formed using reactive sputtering and under a condition of partial pressure of oxygen gas of 0.2 or lower, and plasma is momentarily removed. Next, an upper oxide layer 40b is formed using reactive sputtering and under a condition of partial pressure of oxygen gas of 0.55 or higher. Next, a photosensitive layer is formed on the upper oxide layer 40b, and the oxide semiconductor layer 40 is then formed by a patterning process, such as a photolithography process or an etching process.

Figure 11:
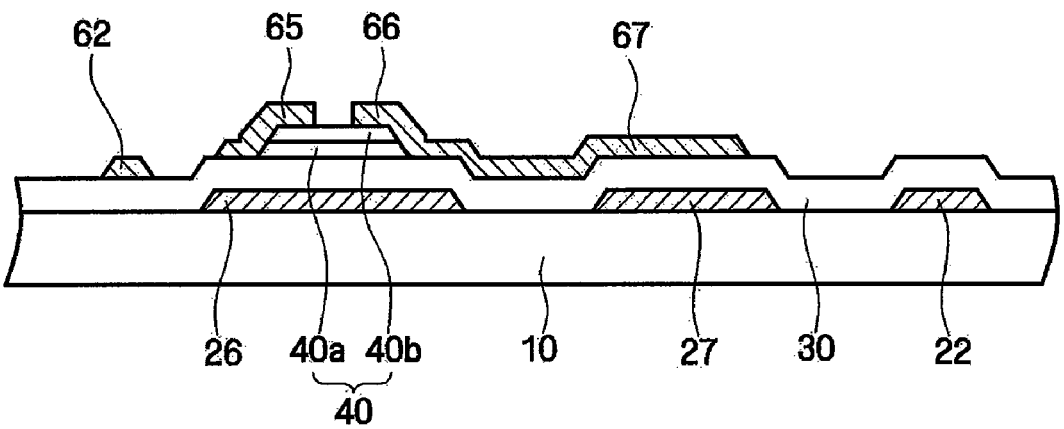

Referring to FIGS. 1 and 11, data wiring 62, 65, 66, 67 is formed on the gate insulating 30 and the oxide semiconductor layer 40 using a method such as sputtering. The source electrode 65 and the drain electrode 66 are separated on either side of the gate electrode 26, and the drain electrode expansion section 67, which extends from the drain electrode 66, overlaps the storage electrode 27.

Figure 12:
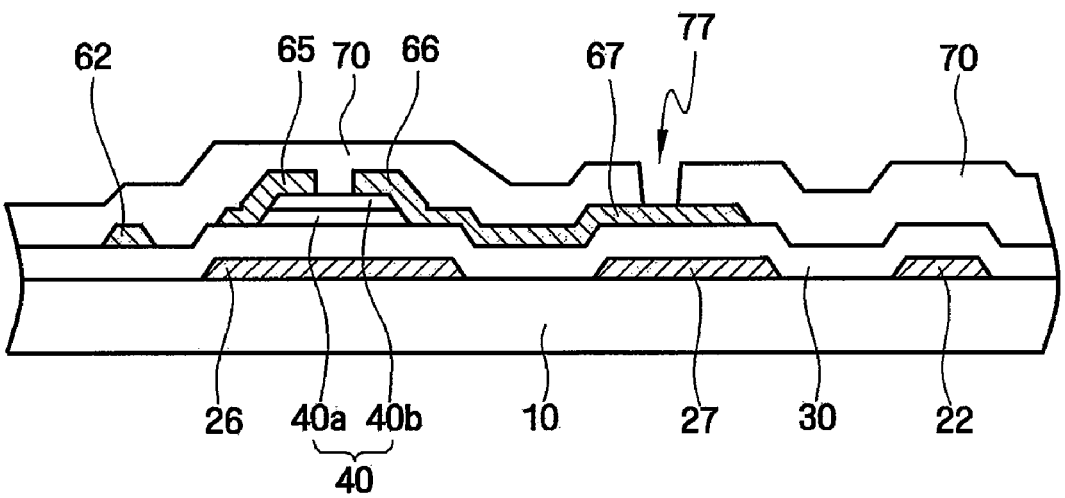

Referring to FIGS. 1 and 12, a protection layer 70 is formed by PECVD or reactive sputtering. The protection layer 70 is patterned by a photolithography process or an etching process to form a contact hole 77 which exposes the drain electrode expansion section 67.

Figure 13:
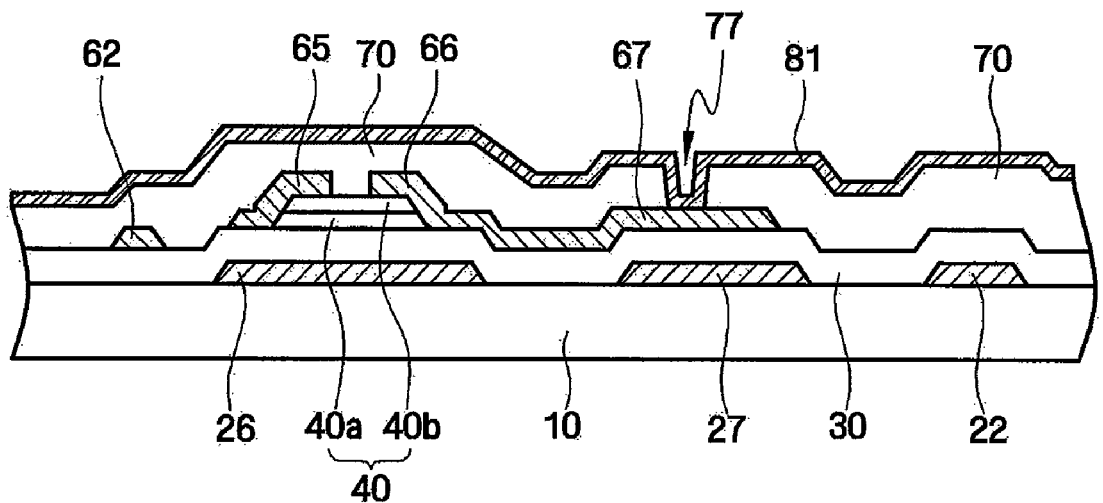

Referring to FIGS. 1 and 13, a conductive layer 81 for use as a pixel electrode and which is connected to the drain electrode expansion section 67 is formed on the protection layer 70. The conductive layer 81 is made of a transparent conductive material such as ITO (Indium Tin Oxide) or IZO (Indium Zinc Oxide), or a reflective conductive material such as aluminum.

Subsequently, with reference to FIGS. 2 and 13, the conductive layer 81 is patterned to form a pixel electrode 82 which is connected to the drain electrode 66.

Figure 14:
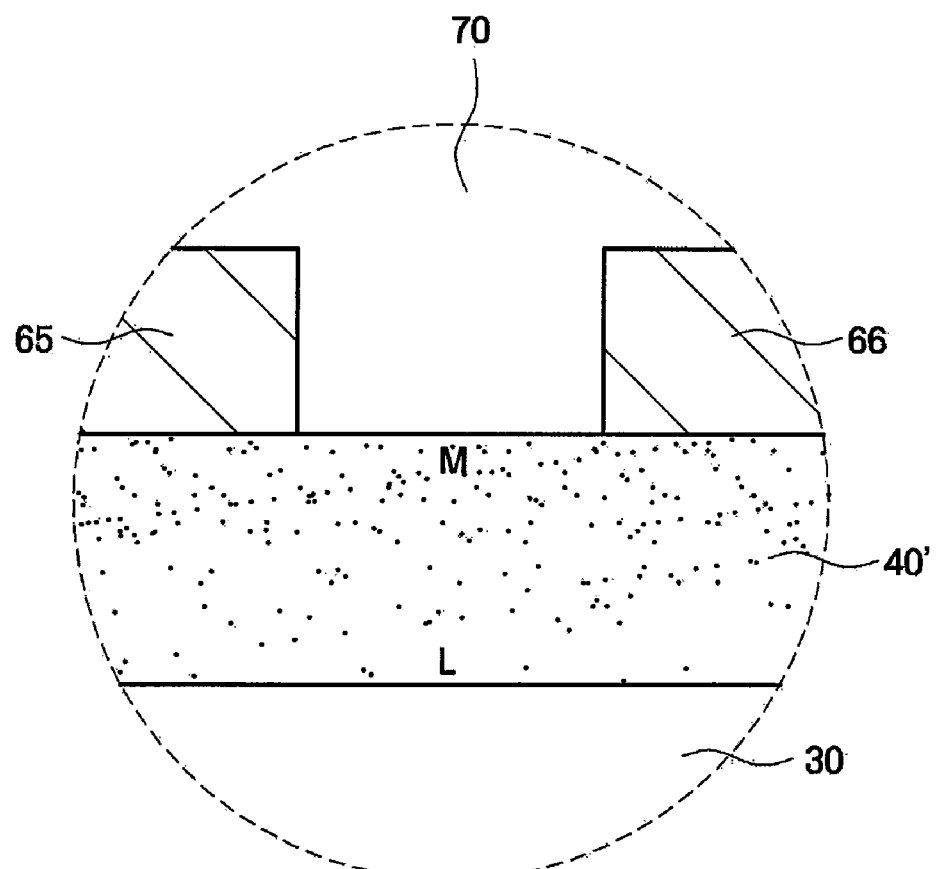
FIG. 14 is a sectional view, illustrating a modified example of an oxide semiconductor layer of FIG. 3.

A heat-treating process such as annealing is performed on the thin film transistor array substrate fabricated as described above. For example, the thin film transistor array substrate may be heat treated for one hour at a temperature between 200 and 300 degrees Celsius. When the temperature and time for heat treating are sufficient, the border between the lower oxide layer 40a and the upper oxide layer 40b which form the oxide semiconductor layer 40 substantially disappears, thereby resulting in an oxide semiconductor layer 40' possessing a single-layer structure with an oxygen concentration gradient along the direction of the thickness of the layer. FIG. 14 shows a modified example of the oxide semiconductor layer of FIG. 3. With reference to FIG. 14, the lower portion L of the oxide semiconductor layer 40' adjacent to the gate insulating layer 30 has an oxygen concentration which is relatively low, while the upper portion M of the oxide semiconductor layer 40' adjacent to the source electrode 65 and the drain electrode 66 has an oxygen concentration which is relatively high. In other words, the upper portion M of the oxide semiconductor layer 40' has an average oxygen concentration that is higher that that of the lower portion L of the oxide semiconductor layer 40'. Through such a configuration in which the oxygen concentration in the single oxide semiconductor layer 40' increases from the bottom thereof to the top of the oxide semiconductor layer 40', both the charge mobility and threshold voltage may be increased.

Although the embodiments of the present invention described above utilize a bottom gate structure in which the gate electrode is arranged below the oxide semiconductor layer, the present invention is not limited in this regard and a top gate structure in which the gate electrode is arranged above the oxide semiconductor layer may also be used.

While the present disclosure of invention has been particularly shown and described with reference to exemplary embodiments thereof, it will be understood by those of ordinary skill in the art in light of the foregoing that various changes in form and details may be made therein without departing from the spirit and scope of the present teachings.

What is claimed is:

1. A thin film transistor array substrate comprising:
    an insulating substrate;
    a gate electrode formed on the insulating substrate;
    an oxide semiconductor layer comprising a lower oxide layer formed on the gate electrode, and an upper oxide layer formed on the lower oxide layer such that oxygen concentration in the upper oxide layer is higher than oxygen concentration in the lower oxide layer; and
    a source electrode and a drain electrode formed on the oxide semiconductor layer and separated from each other,
    wherein the source electrode and the drain electrode are formed directly on the upper oxide layer, where the upper oxide layer that is overlaid by the source and drain electrode is a homogeneous layer.

2. The thin film transistor array substrate of claim 1, wherein the upper oxide layer has a thickness that is 60 to 80% of a total thickness of the oxide semiconductor layer.

3. The thin film transistor array substrate of claim 1, wherein a mobility of the oxide semiconductor layer is 4.5 cm2/Vs or greater, and a threshold voltage of the oxide semiconductor layer is −4V or greater.

4. The thin film transistor array substrate of claim 1, wherein each of the lower oxide layer and the upper oxide layer comprises an oxide of a material selected from Zn, In, Ga, Sn, Hf, and combinations thereof.

5. The thin film transistor array substrate of claim 4, wherein the lower oxide layer and the upper oxide layer are made from the same material.

6. The thin film transistor array substrate of claim 1, wherein an oxygen concentration at the boundary between the lower oxide layer and the upper oxide layer continuously varies.

7. The thin film transistor array substrate of claim 6, wherein the upper oxide layer has an average oxygen concentration that is higher than an average oxygen concentration of the lower oxide layer.

8. A thin film transistor array substrate comprising:
    an insulating substrate;
    a gate electrode formed on the insulating substrate;
    an oxide semiconductor layer comprising a lower oxide layer formed on the gate electrode, and an upper oxide layer formed on the lower oxide layer such that oxygen concentration in the upper oxide layer is higher than oxygen concentration in the lower oxide layer; and
    a source electrode and a drain electrode formed on the oxide semiconductor layer and separated from each other,
    wherein a lower portion of the lower oxide layer is in an amorphous state, and an upper portion of the lower oxide layer is in a crystalline state.

9. The thin film transistor array substrate of claim 8, wherein a lower portion of the upper oxide layer is in an amorphous state, and an upper portion of the upper oxide layer is in a crystalline state.

* * * * *